(12) United States Patent
Sakashita et al.

(10) Patent No.: US 8,872,413 B2
(45) Date of Patent: Oct. 28, 2014

(54) PEROVSKITE OXIDE FILM AND FERROELECTRIC FILM USING THE SAME, FERROELECTRIC DEVICE, AND METHOD FOR MANUFACTURING PEROVSKITE OXIDE FILM

(71) Applicants: FUJIFILM Corporation, Tokyo (JP); Tokyo Institute of Technology, Tokyo (JP)

(72) Inventors: Yukio Sakashita, Ashigarakami-gun (JP); Hiroshi Funakubo, Tokyo (JP); Minoru Kurosawa, Tokyo (JP); Mutsuo Ishikawa, Tokyo (JP); Hiro Einishi, Tokyo (JP); Takahisa Shiraishi, Tokyo (JP)

(73) Assignees: FUJIFILM Corporation, Tokyo (JP); Tokyo Institute of Technology, Tokyo (JP)

( * ) Notice: Subject to any disclaimer, the term of this patent is extended or adjusted under 35 U.S.C. 154(b) by 21 days.

(21) Appl. No.: 13/869,613

(22) Filed: Apr. 24, 2013

(65) Prior Publication Data

US 2013/0234564 A1    Sep. 12, 2013

Related U.S. Application Data

(63) Continuation of application No. PCT/JP2011/005881, filed on Oct. 20, 2011.

(30) Foreign Application Priority Data

Oct. 25, 2010  (JP) .................................. 2010-238592
Mar. 24, 2011  (JP) .................................. 2011-065517

(51) Int. Cl.
*H01L 41/18* (2006.01)
*H01L 41/187* (2006.01)

(Continued)

(52) U.S. Cl.
CPC ............ *H01L 41/1873* (2013.01); *C23C 4/105* (2013.01); *C23C 26/00* (2013.01);

(Continued)

(58) Field of Classification Search
CPC .... H01L 41/1873; H01L 41/083; H01L 41/18
USPC ........................ 310/358, 311, 357, 359, 365; 252/62.9 PZ, 62.9 R; 501/134; 428/332, 428/339

See application file for complete search history.

(56) References Cited

U.S. PATENT DOCUMENTS 7,997,692 B2 *  8/2011  Sakashita et al. ............. 310/358
8,434,856 B2 *  5/2013  Sakashita et al. ............. 423/598

(Continued)

FOREIGN PATENT DOCUMENTS

JP    2004-284889 A    10/2004
JP    2006-188946 A    7/2006

(Continued)

OTHER PUBLICATIONS

Goh et al., "Hydrothermal Epitaxy of I:V Perovskite Thin Films", Mat. Res. Soc. Symp. Proc., vol. 718, D10.13, 2002, pp. 201-206.

(Continued)

*Primary Examiner* — Thomas Dougherty
*Assistant Examiner* — Karen B Addison
(74) *Attorney, Agent, or Firm* — Birch, Stewart, Kolasch & Birch, LLP

(57) ABSTRACT

A perovskite oxide film is formed on a substrate, in which the perovskite oxide film has an average film thickness of not less than 5 μm and includes a perovskite oxide represented by a general formula (P) given below:

$$(K_{1-w-x}A_w B_x)(Nb_{1-y-z}C_y D_z)O_3 \qquad (P),$$

where: $0<w<1.0$, $0\le x\le 0.2$, $0\le y<1.0$, $0\le z\le 0.2$, $0<w+x<1.0$, A is an A-site element having an ionic valence of 1 other than K, B is an A-site element, C is a B-site element having an ionic valence of 5, D is a B-site element, each of A to D is one kind or a plurality of kinds of metal elements.

20 Claims, 8 Drawing Sheets (51) Int. Cl.
| | |
|---|---|
| *C23C 4/10* | (2006.01) |
| *C23C 26/00* | (2006.01) |
| *C23C 30/00* | (2006.01) |
| *H01L 21/02* | (2006.01) |
| *H01L 41/317* | (2013.01) |
| *C23C 28/04* | (2006.01) |
| *C23C 28/00* | (2006.01) |

(52) U.S. Cl.
CPC .......... *C23C 30/00* (2013.01); *H01L 21/02197* (2013.01); *H01L 41/18* (2013.01); *H01L 41/317* (2013.01); *C23C 28/042* (2013.01); *C23C 28/322* (2013.01); *C23C 28/3455* (2013.01); *H01L 21/02282* (2013.01); *H01L 21/02304* (2013.01)
USPC .......................................... 310/358; 310/365

(56) References Cited

U.S. PATENT DOCUMENTS

| | | | |
|---|---|---|---|
| 2006/0125352 A1 | 6/2006 | Sakashita et al. | |
| 2007/0024162 A1 | 2/2007 | Shibata et al. | |
| 2007/0060467 A1* | 3/2007 | Matsuda et al. | 252/62.9 R |
| 2013/0258000 A1* | 10/2013 | Ohashi et al. | 310/311 |

FOREIGN PATENT DOCUMENTS

| | | |
|---|---|---|
| JP | 2006-291332 A | 7/2006 |
| JP | 2007-42740 A | 2/2007 |
| JP | 2007-324538 A | 12/2007 |

OTHER PUBLICATIONS

Inagaki et al., "Dielectric and Piezoelectric Properties of Mn-Doped Na0.5K0.5NbO3 Single Crystals Grown by Flux Method", Applied Physics Express, vol. 1, 061602, 2008, pp. 1-3.
Inagaki et al., "Ferroelectric Domain Structure of Na0.5K0.5NbO3 Crystal Grown by Floating Zone Method", Japanese Journal of Applied Physics, vol. 48, 09KC09, 2009, pp. 1-5.
International Search Report for PCT/JP2011/005881 mailed on Jan. 24, 2012.
Ishikawa et al., "Growth of Epitaxial KNbO3 Thick Films by Hydrothermal Method and Their Characterization", Japanese Journal of Applied Physics, vol. 48, 09KA14, 2009, pp. 1-5.
Ishikawa et al., "Growth of Epitaxial Potassium Niobate Film on (100)SrRuO3/(100)SrTiO3 by Hydrothermal Method and their Electromechanical Propertie", Mater. Res. Soc. Symp. Proc., vol. 1139, GG03-52, 2009, pp. 187-192.
Lin et al., "Dielectric/piezoelectric properties and temperature dependence of domain structure evolution in lead free (K0.5Na0.5)NbO3 single crystal", Solid State Communications, vol. 149, 2009, pp. 1646-1649.
Saito et al., "Lead-free piezoceramics", Nature, vol. 432, Nov. 4, 2004, pp. 84-87.
Suchanek, "Synthesis of Potassium Niobiate (KNbO3) Thin Films by Low-Temperature Hydrothermal Epitaxy", Chem. Mater., vol. 16, 2004, pp. 1083-1090.
Tan et al., "Dielectric properties of hydrothermally epitaxied I-V perovskite thin films", Thin Solid Films, vol. 515, 2007, pp. 6577-6581.
Written Opinion of the International Searching Authority for PCT/JP2011/005881 mailed on Jan. 24, 2012.
Aug. 15, 2014 First Notification of Office Action issued in Chinese Application No. 201180051371.7.

* cited by examiner

PEROVSKITE OXIDE FILM AND FERROELECTRIC FILM USING THE SAME, FERROELECTRIC DEVICE, AND METHOD FOR MANUFACTURING PEROVSKITE OXIDE FILM

CROSS REFERENCE TO RELATED APPLICATIONS

This non-provisional application is a Continuation of International Application No. PCT/JP2011/005881 filed on Oct. 20, 2011, which claims the benefit of Japanese Patent Application Nos. 2010-238592 filed on Oct. 25, 2010 and 2011-065517 filed on Mar. 24, 2011, both are filed in Japan. The entire contents of all of the above applications are hereby incorporated by reference.

TECHNICAL FIELD

The present invention relates to an I-V perovskite oxide film and ferroelectric film using the same, a ferroelectric device, and a method for manufacturing the I-V perovskite oxide film.

BACKGROUND ART

Today, with an increasing interest in the environmental impact, switching to a non-lead based system has been actively conducted for piezoelectric films used for piezoelectric actuators, ultrasound probes, pressure sensors, and the like. As one of non-lead perovskite oxides expected to have high piezoelectric and ferroelectric performance, a I-V perovskite oxide in which A-site element includes a monovalent metal element (K, Na, Li, or the like) and B-site element includes a pentavalent metal element (Nb, Ta, Sb, or the like) has been studied.

Among I-V perovskite oxides expected to have high piezoelectricity and ferroelectricity, a potassium niobate ($KNbO_3$) (hereinafter, KN) perovskite oxides is known as having a high electromechanical coupling coefficient. Among KN perovskite oxides, a potassium sodium niobate (($K, Na)NbO_3$) (hereinafter, KNN) perovskite oxide, which includes an alkali metal element other than potassium, such as Na or the like, in A-site, is expected to be applied to ferroelectric devices, such as ultrasound probes, pressure sensors, and the like, as it has a relatively small dielectric constant, large frequency constant, and the like.

For single crystals and bulk ceramics of KN and KNN perovskite oxides, various manufacturing methods are reported. For the applications to thin and thick film devices, however, they need to be formed by a gas phase film forming method or a liquid phase film forming method. Generally, for thin film forming, an ordinary gas phase method, such as a pulsed laser deposition (PLD), sputtering, or the like, is used as the gas phase film forming method while an ordinary chemical solution method, such as sol-gel method or the like, is used as the liquid phase film forming method. In such film forming methods, high temperature film forming of not less than 600° C. is said to be required in order to obtain a ferroelectric film of good crystallinity.

Alkali metals, such as K, Na, and the like, are highly volatile and also easily spread into an under layer, so that they tend to escape during film forming under a high temperature, thereby causing composition control to be very difficult.

The potassium niobate has phase transition points near 435° C. (Curie temperature) and near 225° C. and, if film forming is performed at an ordinary temperature (near 600° C.), phase transition will occur two times and a crack or a film defect will likely to occur due to volume changes associated with the phase transitions, thereby causing difficulty in stable crystal growth. For a thick film of not less than 5 μm, in particular, a crack or a film defect is more likely to occur due to an increased stress on the film.

Under these backgrounds, hydrothermal synthesis has been drawing attention in recent years as the only way for synthesizing a ferroelectric material at a low temperature and application to the film forming of KN perovskite oxide films is under consideration. It is reported that a KN film can be epitaxially grown on a $SrTiO_3$ substrate with a substrate temperature of about 200° C. in the following non-patent documents: G. K. L. Goh and Suresh K. Donthu, "Hydrothermal Epitaxy of I:V Perovskite Thin Films", Mat. Res. Soc. Symp. Proc., Vol. 718, D10.13, pp. 201-206, 2002; W. L. Suchanek, "Synthesis of Potassium Niobiate ($KNbO_3$) Thin Films by Low-Temperature Hydrothermal Epitaxy", Chem. Mater., Vol. 16, pp. 1083-1090, 2004; and C. K. Tan et al., "Dielectric properties of hydrothermally epitaxied I-V perovskite thin films", Thin Solid Films, Vol. 515, pp. 6577-6581, 2007. But, the electrical properties of the EN film obtained are those that do not reach a practical level in an as-grown evaluation using a surface electrode.

In the mean time, the present inventors have succeeded in producing a KN thin film (thick film) device for the first time in the world by forming a KN epitaxial film on a $SrTiO_3$ substrate through the intermediary of a $SrRuO_3$ electrode layer by hydrothermal synthesis by performing interface design between the substrate and the film and interface control as described, for example, in the following non-patent documents: M. Ishikawa et al., "Growth of Epitaxial Potassium Niobate Film on $(100)SrRuO_3/(100)SrTiO_3$ by Hydrothermal Method and their Electromechanical Properties", Mater. Res. Soc. Symp. Proc., Vol. 1139, GG03-52, pp. 187-192, 2009; M. Ishikawa et al., "Growth of Epitaxial $KNbO_3$ Thick Films by Hydrothermal Method and Their Characterization", Japanese Journal of Applied Physics, Vol. 48, 09KA14, pp. 1-5, 2009.

DISCLOSURE OF THE INVENTION

For solid solutions of potassium niobate with other composite solutions, including KNN perovskite oxide films, no film forming cases of thick films have been reported so far. As the difficulty of producing a bulk single crystal of KNN perovskite oxide is described in the following non-patent documents: Y. Inagaki and Ken-ichi Kakimoto, "Dielectric and Piezoelectric Properties of Mn-Doped $Na_{0.5}K_{0.5}NbO_3$ Single Crystals Grown by Flux Method", Applied Physics Express, Vol. 1, 061602, pp. 1-3, 2008; Y. Inagaki et al., "Ferroelectric Domain Structure of $Na_{0.5}K_{0.5}NbO_3$ Crystal Grown by Floating Zone Method", Japanese Journal of Applied Physics, Vol. 48, 09KC09, pp. 1-5, 2009; and D. Lin et al., "Dielectric/piezoelectric properties and temperature dependence of domain structure evolution in lead free $(K_{0.5}Na_{0.5})NbO_3$ single crystal", Solid State Communications, Vol. 149, pp. 1646-1649, 2009, the composition control for the mixed crystal of potassium niobate is extremely difficult, whereby it is difficult to obtain a single crystal of good crystallinity. As such, a more detailed study for film forming conditions is required for composition control in forming thick films.

The present invention has been developed in view of the circumstances described above, and it is an object of the present invention to provide a potassium niobate mixed crystal perovskite oxide thick film with little composition shift and good crystallinity.

A perovskite oxide film of the present invention is a film formed on a substrate, wherein the film has an average film thickness of not less than 5 μm and includes a perovskite oxide represented by a general formula (P) given below:

$(K_{1-w-x}A_w B_x)(Nb_{1-y-z}C_y D_z)O_3$      (P), where: $0<w<1.0, 0\leq x\leq 0.2, 0\leq y<1.0, 0\leq z\leq 0.2, 0<w+x<1.0$; A is an A-site element having an ionic valence of 1 other than K, B is an A-site element, C is a B-site element having an ionic valence of 5, and D is a B-site element; each of A to D is one kind or a plurality of kinds of metal elements; and although 1:3 is a standard ratio of the total number of moles of the A-site elements and of the total number of moles of the B-site elements to the number of moles of the oxygen atoms, the ratio may be deviated from 1:3 within a range in which a perovskite structure can be formed.

Preferably, in the general formula (P), the element A is at least one kind of metal element selected from the group consisting of Li, Na, Rb, and Cs, and the element B is at least one kind of metal element selected from the group consisting of Ca, Sr, Ba, Sn, Pb, Y, La, and Bi. Further, preferably, the element C is at least one kind of metal element selected from the group consisting of V, Sb, and Ta, and the element D is at least one kind of metal element selected from the group consisting of Ti, Mn, Cr, Fe, Co, Ni, Cu, and Zn.

Preferably, the substrate of the perovskite oxide film of the present invention has a lattice constant of 0.37 to 0.425 nm. Preferably, such a substrate includes, as a major component, a compound selected from the group consisting of strontium titanate, potassium tantalite, calcium fluoride, scandium perovskite oxide, nickel perovskite oxide, and yttria-stabilized zirconia. As for the substrate, a metal substrate or a resin substrate may be used.

The term "major component" as used herein refers to a component with a content of not less than 80 mol %.

Preferably, the film thickness of the perovskite oxide film of the present invention is not less than 10 μm and more preferably not less than 50 μm.

Preferably, the perovskite oxide film has a crystalline orientation and more preferably, the film is a three-axis oriented epitaxial film.

The term "has a crystalline orientation" as used herein is defined as having an orientation factor F not less than 80% measured by Lotgerling method. The orientation factor F is represented by a formula (i) given below.

$F(\%)=(P-P0)/(1-P0)\times 100$      (i)

where, P is a ratio between the sum of reflection intensities and the sum of total reflection intensities from the oriented face. In the case of (001) orientation, P is a ratio between the sum $\Sigma I$ (001) of reflection intensities I (001) from the (001) face and the sum $\Sigma I$(hk1) of reflection intensities I (hk1) from each crystal face (hk1), that is, $\Sigma I(001)/\Sigma I(hk1)$. For example, in a perovskite crystal, if the orientation is (001), $P=I(001)/[I(001)+I(100)+I(101)+I(110)+I(111)]$. P0 corresponds to P of a sample having perfect random orientation. In perfect random orientation (P=P0), F=0%, while in perfect orientation (P=1), F=100%.

Preferably, the perovskite oxide film of the present invention is a ferroelectric film.

A ferroelectric device of the present invention includes the aforementioned substrate, the ferroelectric perovskite oxide film of the present invention, and a pair of electrodes for applying an electric field to the perovskite oxide film. Preferably, in the configuration described above, the major component of a back contact electrode of the pair of electrodes formed between the substrate and the perovskite oxide film is Pt, $LaNiO_3$, a lanthanum layered perovskite compound, such as $La_2NiO_4$ and the like, or $SrRuO_3$.

Further, it is preferable that the ferroelectric device of the present invention includes a buffer layer between the substrate and the back contact electrode.

A perovskite oxide film forming method of the present invention is a method for forming the perovskite oxide film of the present invention described above in which the film forming is performed by hydrothermal synthesis.

Preferably, in the perovskite oxide film forming method of the present invention, the film forming is performed at a film forming temperature of not greater than 300° C. The term "film forming temperature" as used herein refers to an average temperature of a reaction solution in which the substrate is immersed at the time of film forming in the hydrothermal synthesis.

In low-temperature film forming for potassium niobate mixed crystal perovskite oxide films by hydrothermal synthesis, the present inventors have earnestly studied factors that may affect the composition and found out film forming conditions for forming a potassium niobate mixed crystal perovskite oxide film with little composition shift under a relative low temperature less than Curie temperature. Therefore, the present invention may provide, on a substrate, a potassium niobate mixed crystal perovskite oxide film having a film thickness of not less than 5 μm with little composition shift, good crystallinity, and less defects, such as cracks and the like.

As described above, the perovskite oxide film of the present invention can be a non-lead ferroelectric film with a film thickness of not less than 5 μm, so that a ferroelectric device utilizing such a perovskite oxide film as the ferroelectric film may be used as a high performance non-lead ferroelectric device in the field of ultrasound probes and the like.

BEST MODE FOR CARRYING OUT THE INVENTION

[Perovskite Oxide Film, Perovskite Oxide Structure, and Ferroelectric Device]

As described under the "Background Art", the composition control for potassium niobate perovskite oxide is difficult due to high volatility of the potassium, and composition control in the production of mixed crystal thereof is further difficult. In the case where a mixed crystal that includes an alkali metal element other than potassium as an A-site element of potassium sodium niobate or the like is produced, in particular, the difficulty is further increased due to high volatility of the alkali metal element.

Further, the potassium niobate has a phase transition point (Curie temperature) from cubic crystal to tetragonal crystal near 435° C. and a phase transition point from tetragonal crystal to orthorhombic crystal near 225° C. Therefore, if film forming is performed, in particular, at a temperature not less than the Curie temperature, the film will pass two phase transition points during cooling after the film forming. If the film is a thick film with a thickness of not less than 5 μm, the stress generated by a volume change arising from the phase transitions is contained inside of the thick film because it is bound to the substrate and, as a result, a crack or a film defect is likely to occur. For this reason, in the potassium niobate mixed crystal perovskite oxide thick film, a film having good crystallinity has not been obtained heretofore.

The present inventors have earnestly conducted investigations in film forming for forming potassium niobate mixed crystal perovskite oxide thick film in hydrothermal synthesis which is a method capable of producing a perovskite oxide having good crystallinity at a relatively low temperature of less than or equal to 300° C. and have succeeded in optimizing the difference between the lattice constant of a perovskite oxide to be formed and the lattice constant of the substrate used, and controlling the composition of a reaction solution in hydrothermal synthesis, thereby making it possible to form a potassium niobate mixed crystal perovskite oxide thick film having little composition shift and good crystallinity with little crack and film defect at a relatively low film forming temperature of not greater than the Curie temperature of potassium niobate.

As described above, the perovskite oxide film of the present invention can be a non-lead ferroelectric film with a film thickness of not less than 5 μm, so that a ferroelectric device utilizing such a perovskite oxide film as the ferroelectric film may be used as a high performance non-lead ferroelectric device in the field of ultrasound probes (vibrators) and the like.

Figure 1:
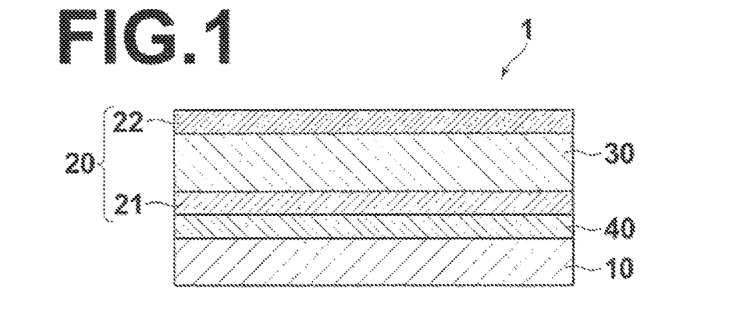
FIG. 1 is a schematic cross-sectional view of a ferroelectric device having a perovskite oxide film according to an embodiment of the present invention taken along a thickness direction, illustrating the configuration thereof.

Hereinafter, a structure of a ferroelectric device having a perovskite oxide film (perovskite oxide structure) according to an embodiment of the present invention and a manufacturing method thereof will be described with reference to the accompanying drawings. FIG. 1 is a cross-sectional view of the ferroelectric device (perovskite oxide structure) taken along a thickness direction. Each component in the drawings is not necessarily drawn to scale for ease of visual recognition.

As illustrated in FIG. 1, the ferroelectric device (perovskite oxide structure) 1 includes a substrate 10 on which a pair of electrodes 20 of a back contact electrode 21 and an upper electrode 22, and a ferroelectric film 30 of a perovskite oxide film sandwiched by the pair of electrodes 20 are provided.

The ferroelectric film 30 is a film which includes, as a major component, a perovskite oxide represented by a general formula (P) given below and an electric field is applied in the thickness direction by the back contact electrode 21 and the upper electrode 22:

$$(K_{1-w-x}A_w B_x)(Nb_{1-y-z}C_y D_z)O_3 \qquad (P),$$

where: $0<w<1.0$, $0 \leq x \leq 0.2$, $0 \leq y<1.0$, $0 \leq z \leq 0.2$, $0<w+x<1.0$; A is an A-site element having an ionic valence of 1 other than K, B is an A-site element, C is a B-site element having an ionic valence of 5, and D is a B-site element; each of A to D is one kind or a plurality of kinds of metal elements; and although 1:3 is a standard ratio of the total number of moles of the A-site elements and of the total number of moles of the B-site elements to the number of moles of the oxygen atoms, the ratio may be deviated from 1:3 within a range in which a perovskite structure can be formed.

There is not any specific restriction on a substrate used for the substrate 10, as long as it has good lattice matching with the ferroelectric film 30 to be layered thereon, but it is preferable to use a substrate having a lattice constant close to that of the perovskite oxide film to be formed.

As the lattice constant of a potassium niobate mixed crystal perovskite oxide is 0.388 to 0.405 nm, a preferable lattice constant of a lattice matched substrate is 0.37 to 0.425 nm. As for such substrate, a substrate that includes, as a major component, a compound selected from the group consisting of trontium titanate (0.3905 nm) and potassium tantalite (0.3989 nm) is preferable. Further, as for the substrate that rotates the lattice by 45 degrees for matching, a substrate that includes, as a major component, a compound selected from the group consisting of calcium fluoride (0.546 nm), scandium perovskite oxide (0.543 nm to 0.579 nm), nickel perovskite oxide (0.512 nm to 0.546 nm), and yttria-stabilized zirconia (0.514 nm) is preferable.

In the case where the lattice constant of the substrate 10 falls outside of the aforementioned range, the lattice matching with the perovskite oxide film 30 may be adjusted by providing a buffer layer 40 between the substrate 10 and the back contact electrode 21. Further, such configuration allows a metal or resin substrate to be used as the substrate 10.

There is not any specific restriction on the metal substrate, but a stainless (SUS) or inconel substrate, or the like is preferable from the viewpoint of corrosion resistance. As for the resin substrate, a highly flexible substrate is preferable if it is heat resistant at the film forming temperature. From the viewpoint of heat resistance, a substrate which includes, as a major component, a super engineering plastic (polyimide, polysulfone, Teflon® or the like) or a derivative thereof is preferable.

As for the buffer layer 40, a layer having a lattice constant which falls within a difference range of not greater than 5% of those of the substrate 10, back contact electrode layer 21, and perovskite oxide film 30 is preferably used. The buffer layer 40 may be provided for improving orientation or adhesion, as well as lattice matching described above.

There is not any specific restriction on the major component of the back contact electrode 21, but $SrRuO_3$, $LaNiO_3$, a lanthanum layered perovskite compound, such as $La_2NiO_4$, $La_3Ni_2O_7$, $La_4Ni_3O_{10}$, and $La_2CuO_4$, or Pt is preferable, as in the substrate, since they have good lattice matching with each layer to be layered and allow ease of orientation control.

There is not any specific restriction on the major component of the upper electrode 22 and a metal or a metal oxide, such as, Au, Pt, Ir, Al, Ta, Cr, Cu, $IrO_2$, $RuO_2$, $LaNiO_3$, $La_2NiO_4$, $SrRuO_3$, and the like, or a combination thereof is preferable.

There is not any specific restriction on the thickness of each of the back contact electrode 21 and the upper electrode 22, and requires a minimum thickness to ensure required conductivity for effectively applying, as an electrode, an electric field to the ferroelectric body 30. The minimum thickness may be determined based on the conductivity of the electrode material used and the overall size of the ferroelectric device 1 and, for example, a range of 50 to 1000 nm is preferable. Further, each electrode may have a multilayer structure.

In the ferroelectric device 1 of the present embodiment, the ferroelectric film 30 is a thick film having a thickness not less than 5 μm. For ultrasound probe and piezoelectric power generation applications, a thicker film thickness is preferable, in which a film thickness of not less than 10 μm is more preferable and not less than 50 μm is still more preferable.

There is not any specific restriction on the ferroelectric film 30 and any film may be used as long as it includes, as a major component, a perovskite oxide represented by the general formula (P) given above.

In the general formula (P), the element A is a metal element having an ionic valence of 1 and, as for the metal element having an ionic valence of 1, at least one metal element selected from the group consisting of Li, Na, Rb, and Cs is preferable.

The element B is an additional element of A-site and at least one metal element selected from the group consisting of Ca, Sr, Ba, Sn, Pb, Y, La, and Bi is preferable. Above all, (K, Na)$NbO_3$ is preferable as it has excellent ferroelectric properties and high performance can be expected when it is applied to a ferroelectric device.

The element C is a metal element having an ionic valence of 5 and at least one metal element selected from the group consisting of V, Sb, and Ta is preferable.

The element D is an additional element of B-site and at least one metal element selected from the group consisting of Ti, Mn, Cr, Fe, Co, Ni, Cu, and Zn is preferable. Addition of the elements B and D of such additional elements allows the ferroelectric device to have more excellent ferroelectric properties.

The phase structure of the perovskite oxide represented by the general formula (P) which is the major component of the perovskite oxide film of the present invention may sometimes take a multi-phase mixed crystal structure in which $KNbO_3$ and the other component (e.g., $ANbO_3$ or $KCO_3$) coexist or may other times take a single phase structure in which each component is completely dissolved into a solid solution, or the other structures may also be possible.

There is not any specific restriction on the orientation of the ferroelectric film 30 and a multi-crystal film having a uniaxial orientation of <001> or an epitaxial film having a triaxial orientation is preferable as it may provide good properties. In the case where an epitaxial film is formed as the ferroelectric film 30, preferable combinations of back contact electrode/substrate may include, but not limited to, the following: $SrRuO_3$/$SrTiO_3$, Pt/MgO, $SrRuO_3$/MgO/Si, $SrRuO_3$/Pt, $SrRuO_3$/$LaNiO_3$/Pt, $SrRuO_3$/$LaNiO_3$/$CaF_2$, $SrRuO_3$/$LaNiO_3$/$CeO_2$/YSZ/Si, $SrRuO_3$/$La_2NiO_4$/$CaF_2$, $SrRuO_3$/YSZ (yttria-stabilized zirconia)/Si, $SrRuO_3$/$La_2NiO_4$/$CeO_2$/YSZ/Si, and $SrRuO_3$/Pt/$CeO_2$/YSZ/Si.

It may be confirmed whether or not the ferroelectric film 30 has a uniaxial orientation by X-ray diffractometry. For example, if the film is a <100> epitaxial film, for peaks arising from the piezoelectric body in the 2θ/θ measurement of X-ray diffractometry, only those of {L00} planes (L=1, 2, 3, - - -, n; n is an integer) such as {100}, {200}, and the like are detected. Further, in a pole figure measurement of {110} asymmetric plane, a four-fold symmetric spot-like pattern can be obtained at every 90° on the same radial position representing an inclination of about 45° from the center.

Further, in the <011> uniaxially oriented ferroelectric film 30, a crystal from which an eight-fold or twelve-fold symmetric pattern can be obtained on the same radial position representing an inclination of 45° from the center when a pole figure measurement of {110} asymmetric plane is performed or a crystal whose pattern represents ellipsoidal spots is possible. As such crystals have intermediate symmetry between those of the single crystal and uniaxially oriented crystal of the present embodiment, they are deemed, in a broad sense, as single or uniaxially oriented crystals. Further, such cases in which a plurality of crystalline phases is mixedly present, a crystal due to bicrystal is mixely present, and transition, defects, and the like are present, are also deemed, in a broad sense, as single crystals or uniaxially oriented crystals. Hereinafter, a film forming method for forming the perovskite oxide film of the present embodiment will be described by taking potassium sodium niobate as an example.

As described above, the perovskite oxide film of the present embodiment is formed by hydrothermal synthesis at a film forming temperature (reaction solution temperature) not greater than the Curie temperature.

The Curie temperature of the perovskite oxide represented by the general formula (P) given above differs depending on the composition thereof. But, as the Curie temperature of potassium niobate is near 435° C., a film forming temperature not greater than 300° C. can be said to be below the Curie temperature if the potassium niobate occupies a large portion of the composition.

In the case of potassium sodium niobate, the range of w representing a composition of potassium and sodium in the general formula (P) is limited to 0<w<1.0 and the range of Curie temperature Tc is 435° C.<Tc(° C.)<643° C. (the Curie temperature of sodium niobate is 643° C.).

As for the reaction solution used in the hydrothermal synthesis, a solution prepared by dissolving niobium oxide in an aqueous solution of mixture of potassium hydroxide and sodium hydroxide mixed at a predetermined ratio is preferable. Alternatively, a reaction solution prepared by mixing powder of sintered body of each of potassium niobate and sodium niobate and dispersing the mixture in pure water may be used. The present inventors tried to control the composition of potassium niobate mixed crystal perovskite oxide in the hydrothermal synthesis at a temperature not greater than the Curie temperature.

But, the present inventors have found out that, in the hydrothermal synthesis, there is a great difference in hydrothermal growth rate, between the potassium niobate and sodium niobate, and the compositions in the film formed differs greatly with respect to the compositions of potassium hydroxide and sodium hydroxide in the reaction solution.

In the mean time, when the concentration of the material in the reaction solution becomes thin in hydrothermal synthesis, the ordinary deposition mode is changed to etching mode in which the already deposited product is dissolved. Thus, in order to obtain a thick film, it is necessary to adjust the material concentration in the reaction solution and reaction rate to avoid changing to the etching mode as much as possible. The present inventors have found out that the dissolved amount of niobic acid in the deposited perovskite oxide varies with the concentration ratio between the potassium hydroxide and sodium hydroxide in the reaction solution.

Figure 2A:
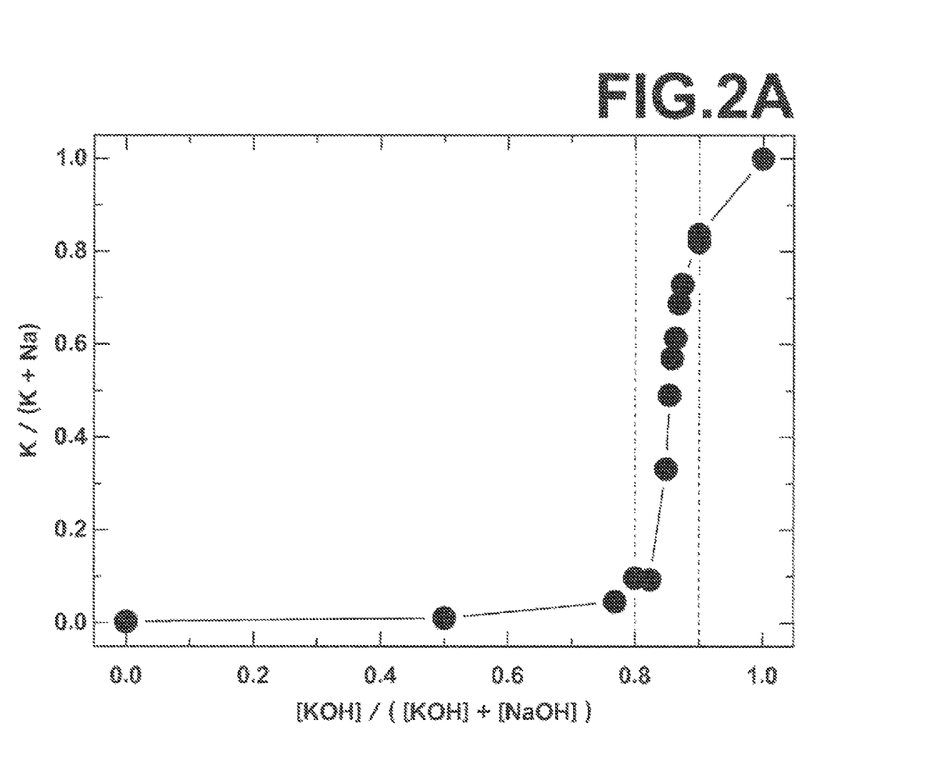
FIG. 2A illustrates potassium compositions in a perovskite oxide film versus potassium compositions in a reaction solution in Example 1.
Figure 2B:
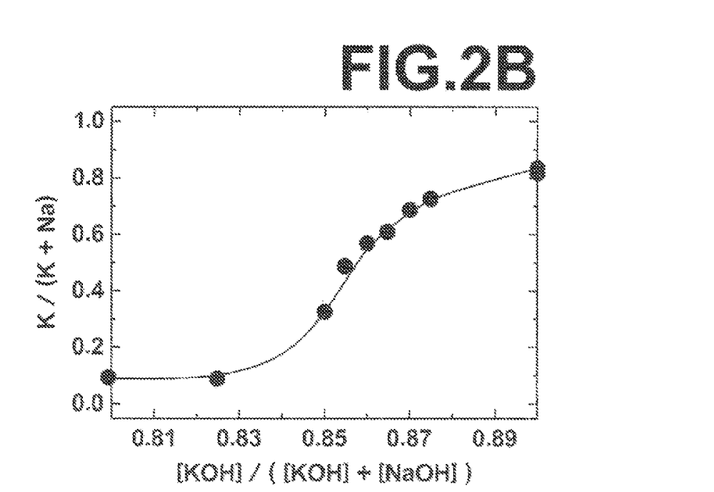
FIG. 2B is a partially enlarged view of FIG. 2A.

As a result, the present inventors have succeeded in forming a potassium sodium niobate perovskite oxide thick film having a film thickness of not less than 5 μm with controlled Na content in the range of 0<Na/(K+Na)<1.0 by performing film forming using a substrate having good lattice matching, and a reaction solution and temperature that causes the deposition mode to be predominant, as shown in Examples to be described later (FIGS. 2A and 2B).

In FIGS. 2A and 2B, the horizontal axis represents the ratio of potassium hydroxide to the total amount of potassium hydroxide and sodium hydroxide in the reaction solution while the vertical axis represents the ratio of potassium ions to the total amount of potassium ions and sodium ions in the film formed.

FIG. 2A illustrates that the ratio of potassium ions in the film is rapidly increased from about 0 to about 1 in a region in which the ratio of the potassium hydroxide in the reaction solution is 0.8 to 0.9. This means that the A-site composition of the perovskite oxide film does not correspond to the reaction solution composition and a hydrothermal growth of mixed crystals mainly takes place only in a narrow composition region in which the potassium concentration in the reaction solution is near 0.8 to 0.9.

FIG. 2B is an enlarged view of the aforementioned potassium concentration region of the reaction solution enlarged in order to examine the correlation between the reaction solution composition and film composition in the region in which the potassium concentration of the reaction solution is 0.8 to 0.9. FIG. 2B shows that the potassium content in the perovskite oxide film formed is controlled within the range of 0<K/(K+Na)<1.0 in the region in which the potassium concentration of the reaction solution is 0.8 to 0.9.

Figure 3:
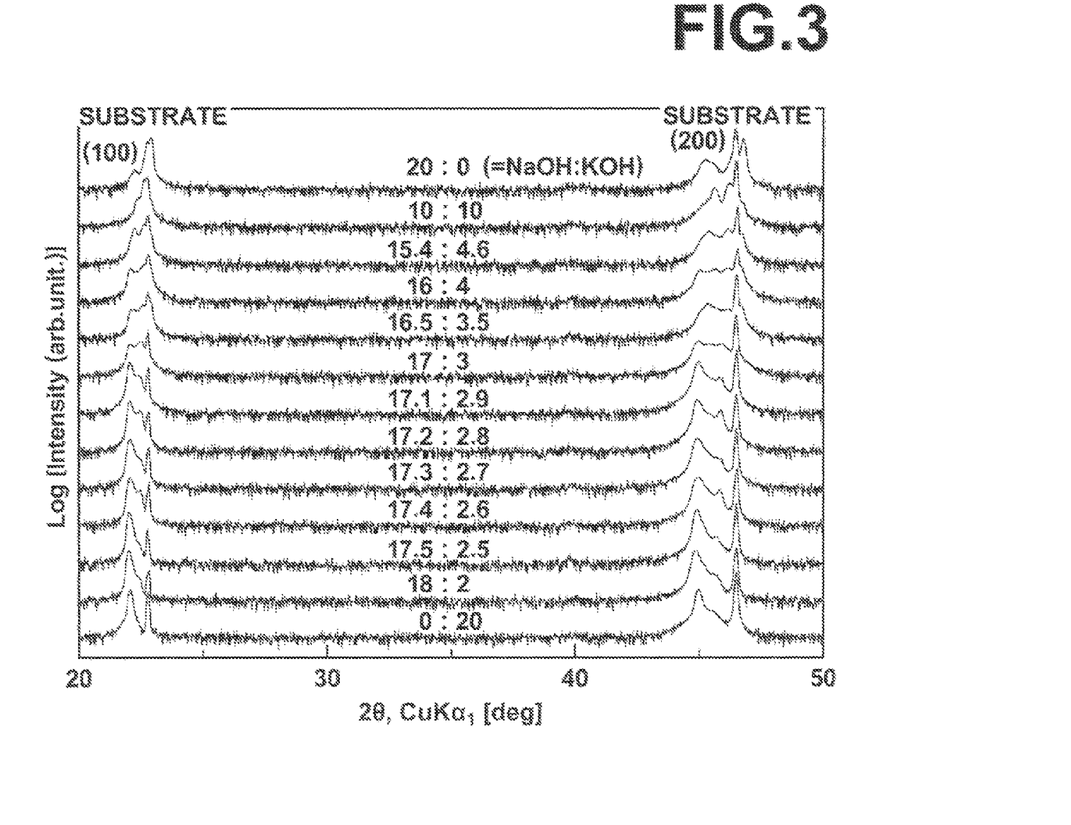
FIG. 3 illustrates XRD spectra of the perovskite oxide films in Example 1.

The hydrothermally synthesized film shown in FIGS. 2A and 2B is confirmed by XRD to be a {100} oriented epitaxial film in an Example to be described later (Example in FIG. 3).

Figure 4A:
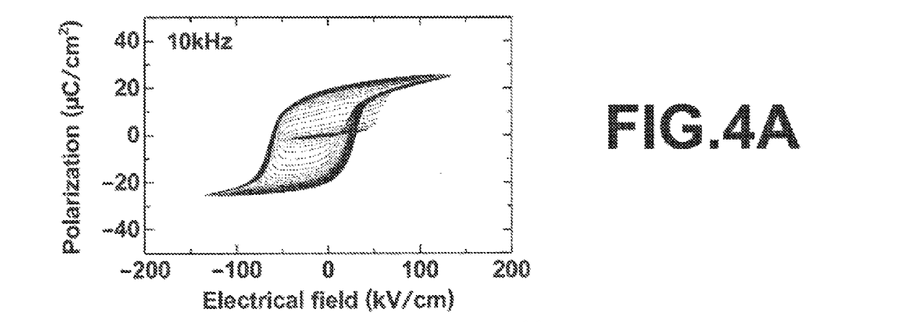
FIG. 4A illustrates P-E hysteresis characteristics of a ferroelectric device in Example 1.

Further, as a result of evaluation of a 10 μm thick sample with a composition of K/(K+Na)=0.83 for ferroelectric properties, hysteresis representing good ferroelectricity has been confirmed. This proves that a perovskite oxide film with little composition shift and good crystallinity has been obtained (FIG. 4A).

As for synthesis of potassium niobate by hydrothermal synthesis, an example in which the synthesis is conducted at about 30° C. for powder is reported. Thus, it is said that a potassium sodium niobate thick film can be formed as long as the reaction temperature is about 30° C. or higher. By adjusting the reaction solution to the reaction condition that causes the deposition mode to be predominant according to the reaction temperature, a potassium sodium niobate thick film having little composition shift and good crystallinity can be formed.

A further thick film can be formed by replacing or replenishing the reaction solution continuously or intermittently (including batch type) such that the composition of the reaction solution that allows good crystal growth is maintained. As will be illustrated in Examples to be described later, the present inventors have succeeded in forming a potassium sodium niobate thick film having a maximum film thickness of 50 μm.

As described above, the perovskite oxide film formed by hydrothermal synthesis is a film that includes a hydroxyl group. The content of the hydroxyl group is very small and the crystallinity is substantially not influenced, but the content varies according to the film forming condition.

Post annealing may be performed on the produced perovskite oxide film 30 in order to make it a further high performance (ferroelectricity) film. Preferably, the post annealing temperature is in the range of 300° C. to 900° C.

So far, the synthesis method of potassium sodium niobate has been described. The potassium niobate mixed crystal perovskite oxide films, including solid solutions having potassium sodium niobate as a constituent, can be produced extensively by the hydrothermal synthesis in the same manner as that of potassium sodium niobate.

As described above, in the film forming of a potassium niobate mixed crystal perovskite oxide film, the present invention may successfully control the composition of the film at a reaction temperature not higher than the Curie temperature. According to the film forming method for forming a perovskite oxide film of the present invention, a potassium niobate mixed crystal perovskite oxide film 30, which is a perovskite oxide film formed on a substrate 10, having a film thickness of not less than 5 μm with little composition shift, good crystallinity, and less defects, such as cracks or the like, may be provided.

The perovskite oxide film 30 can be a non-lead ferroelectric film with a film thickness of not less than 5 μm, so that a ferroelectric device utilizing such a perovskite oxide film as the ferroelectric film may be used as a high performance non-lead ferroelectric device in the field of ultrasound probes and the like.

The perovskite oxide film 30 is a film formed on the substrate 10, but it may also be used by detaching from the substrate 10 after formed.

[Design Changes]

It is to be understood that the present invention is not limited to the embodiment of the present invention described above, and various changes and modifications may be made without departing from the spirit and scope of the present invention.

In the aforementioned embodiment, the description has been made of a case in which the perovskite oxide film of the present invention is used as a ferroelectric film, but the perovskite oxide film of the present invention may also be used as a piezoelectric film having good piezoelectric properties.

In particular, as the stable crystalline system of the potassium niobate is orthorhombic system, it is possible to create a morphotropic phase boundary (MPB) composition by controlling the composition as a mixed crystal system with a composite oxide whose stable crystalline system is other than the orthorhombic system.

The perovskite oxide having the MPB composition is known to have high piezoelectric properties and, for example, $(Na_{0.52}K_{0.44}Li_{0.04})(Nb_{0.86}Ta_{0.10}Sb_{0.04})O_3$ (commonly known as "LF4") developed by Toyota Central R&D Labs., Inc. realizes high piezoelectric properties using the MPB between orthorhombic system and tetragonal system as described, for example, Y. Saito et al., "Lead-free piezoceramics" Nature, Vol. 432, pp. 84-87, Nov. 4, 2004.

EXAMPLES

Examples according to the present invention and comparative examples will now be described.

Example 1

A (100) $SrTiO_3$ (STO) substrate with a thickness of 500 μm was prepared and a $SrRuO_3$ (SRO) back contact electrode was formed on the surface of the substrate with a thickness of about 60 nm by sputtering. In forming the electrode, a commercially available SRO target was used as the target under the following film forming conditions: output power of 60 W;

substrate temperature of about 600° C.; deposition pressure of 27 Pa; argon-oxygen ratio of 20/5; substrate-target distance of 120 mm; and deposition time of about 220 minutes.

Then, reaction solutions were prepared. $9 \times 10^{-4}$ mol of $Nb_2O_5$ powder, 7 mol/l of KOH, and 7 mol/l of NaOH were provided and mixed to prepare for a 20 ml of reaction solution having each of the predetermined compositions shown in Table 1.

Each reaction solution shown in Table 1 was put into a temperature controllable reaction vessel and the temperature was controlled such that the temperature of each reaction solution becomes 240° C. Then the substrate with the back contact electrode was immersed into the reaction solution to perform film forming by hydrothermal synthesis. As a result, a thick film having a film thickness of about 10 μm was obtained regardless of which reaction solution was used after a reaction time of six hours.

A composition analysis was performed on each obtained film. The composition analysis was conducted using an X-ray fluorescence spectrometer (wavelength-dispersive X-ray fluorescence spectrometry PW2404, PANalytical). The results are shown in FIGS. 2A and 2B. In FIGS. 2A and 2B, the horizontal axis represents the ratio of potassium hydroxide to the total amount of potassium hydroxide and sodium hydroxide in the reaction solution while the vertical axis represents the ratio of potassium ions to the total amount of potassium ions and sodium ions in the film formed.

As illustrated in FIG. 2A, it has been found that the ratio of potassium ions in the film is rapidly increased from about 0 to about 1 in a region in which the ratio of the potassium hydroxide in the reaction solution is 0.8 to 0.9 and the A-site composition of the perovskite oxide film does not correspond to the reaction solution composition and a hydrothermal growth of mixed crystals mainly takes place only in a narrow composition region in which the potassium concentration in the reaction solution is near 0.8 to 0.9.

As illustrated in FIG. 2B, the aforementioned potassium concentration region of the reaction solution was enlarged to examine the correlation between the reaction solution composition and film composition in the region in which the potassium concentration of the reaction solution is 0.8 to 0.9. FIG. 2B shows that the potassium content in the perovskite oxide film formed is controlled within the range of 0<K/(K+Na)<1.0 in the region in which the potassium concentration of the reaction solution is 0.8 to 0.9.

Next, XRD measurements were performed on the films obtained. As a result, it has been confirmed that each film obtained is a perovskite oxide film with little pyrochlore phase (FIG. 3).

Figure 4B:
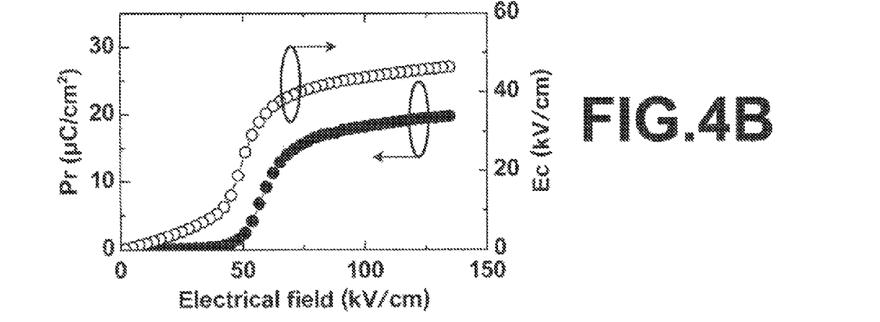
FIG. 4B illustrates field strength dependency of remnant polarization of the ferroelectric device in Example 1.

Further, as a result of evaluation of a 10 μm thick sample with a composition of K/(K+Na)=0.83 for ferroelectric properties by a ferroelectrics evaluation system (FCE of Toyo Corporation), hysteresis representing good ferroelectricity has been confirmed. This proves that a perovskite oxide film with little composition shift and good crystallinity has been obtained (FIG. 4A). Further, as illustrated in FIG. 4B, it has also been confirmed that the hysteresis curve is saturated at a field intensity of about 100 kV/cm and greater.

TABLE 1

| No. | KOH (ml) | NaOH (ml) | [KOH]/([KOH] + [NaOH]) |
|---|---|---|---|
| 1 | 0 | 20 | 0 |
| 2 | 10 | 10 | 0.5 |
| 3 | 15.4 | 4.6 | 0.77 |
| 4 | 16 | 4 | 0.8 |
| 5 | 16.5 | 3.5 | 0.825 |
| 6 | 17 | 3 | 0.85 |
| 7 | 17.1 | 2.9 | 0.855 |
| 8 | 17.2 | 2.8 | 0.86 |
| 9 | 17.3 | 2.7 | 0.865 |
| 10 | 17.4 | 2.6 | 0.87 |
| 11 | 17.5 | 2.5 | 0.875 |
| 12 | 18 | 2 | 0.9 |
| 13 | 20 | 0 | 1 |

Example 2

As the substrate, following three substrates were provided.

<Substrate 1> inconel substrate (300 μm thickness)

<Substrate 2> $SrRuO_3$ (SRO)/inconel substrate (300 μm thickness)

Film forming conditions: A $SrRuO_3$ (SRO) was formed on a 300 μm thick inconel substrate by sputtering with a thickness of about 120 nm as a buffer layer. A commercially available SRO target was used as the target, Film forming conditions: output power of 40 W; substrate temperature of about 600° C.; deposition pressure of 8 Pa; argon-oxygen ratio of 70/30; substrate-target distance of 70 mm; and deposition time of about 60 minutes.

<Substrate 3> SRO/$La_2NiO_4$ (LNO)/inconel substrate (300 μm thickness)

Film forming conditions: A SRO (film thickness of about 120 nm)/La2NiO4 (LNO) (film thickness of about 150) was formed on a 300 μm thick inconel substrate by sputtering as a buffer layer. A commercially available SRO and LNO targets were used as the targets. With respect to the LNO, film forming was performed under three-stage film forming conditions in which the film forming temperature was gradually increased. The film forming conditions of each layer are described in Table 2.

TABLE 2

| | Target | Output Power (W) | Deposition Temperature | Deposition Pressure (Pa) | Argon/Oxygen | Distance between Substrate-Target (mm) | Deposition Time (min.) |
|---|---|---|---|---|---|---|---|
| LNO Layer 1 | LNO | 50 | 350 | 1.3 | 30/10 | 70 | 40 |
| LNO Layer 2 | | | 650 | 8 | 100/7 | | 40 |
| LNO Layer 3 | | | 670 | 3 | 40/1 | | 120 |
| SRO Layer | SRO | 60 | 550 | 27 | 20/5 | 120 | 220 |

A 20 ml of reaction solution having the same composition as that of No. 12 in Table 1 was prepared, as in Example 1. The reaction solution was put into a temperature controllable reaction vessel and the temperature was controlled such that the reaction solution temperature becomes 240° C., and each of the substrates 1 to 3 was immersed into the reaction solution to form a (K, Na)NbO$_3$ film by hydrothermal synthesis.

Figure 5:
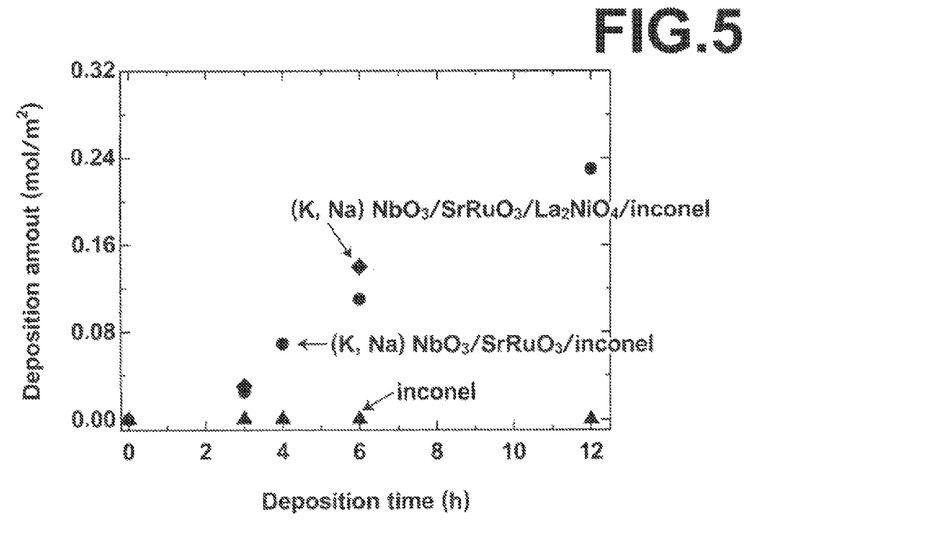
FIG. 5 illustrates $(K, Na)NbO_3$ film formability of various underlayer compositions in Example 2.

Deposition time dependency of (K, Na)NbO$_3$ film deposition amount on the substrates 1 to 3 is illustrated in FIG. 5. No film deposition was observed on the substrate 1 without any buffer layer until 12 hours after the start of deposition, while the deposition amounts on the substrates 2 and 3 were monotonically increased with the deposition time. FIG. 3 shows that the substrate 3 has highest film formability.

Figure 6:
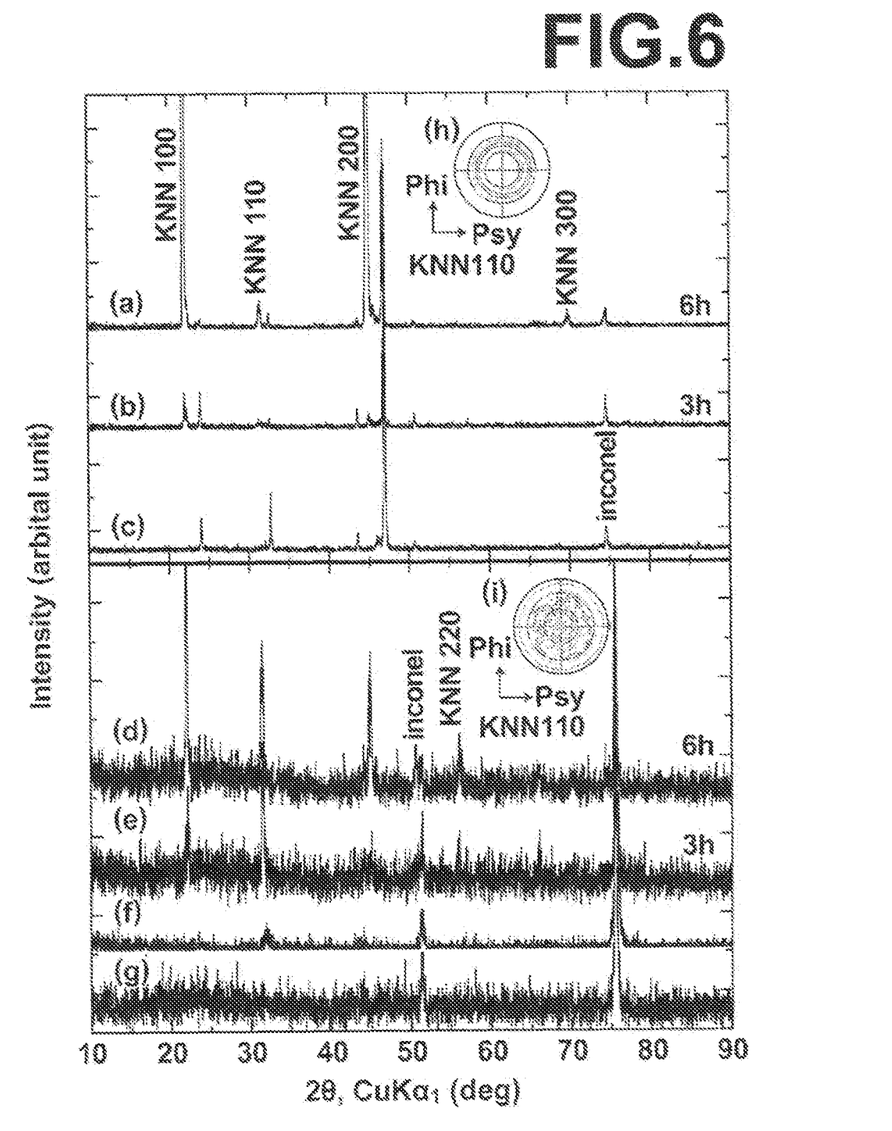
FIG. 6 illustrates XRD spectra and pole figures of perovskite oxide films in Example 2.

Next, XRD measurements and pole figure measurements were performed on each of the substrates 2 and 3 at the deposition times of three and sixe hours. The results of which are shown in FIG. 6. In FIG. 6, the spectra (a) to (c) are of the substrate 3 while the spectra (d) to (f) are of the substrate 2, in which the spectra (c) and (f) are of the respective substrate themselves and (g) is the XRD spectrum of the substrate 1. Further, pole figures are illustrated in (h) and (i) respectively.

As shown in FIG. 6, it has been confirmed that a random oriented film is deposited on the substrate 2 (SrRuO$_3$(SRU)/inconel substrate) while a strongly {100} oriented film is deposited on the substrate 3 (SRO/La$_2$NiO$_4$(LNO)/inconel substrate).

Next, composition analyses, electrical characteristics, and piezoelectric properties were evaluated for the films obtained. For evaluations, films deposited for six hours on the substrates 2 and 3 were used. The film thicknesses of the (K, Na)NbO$_3$ after six hours of deposition were 5.1 μm on the substrate 2 and 6.0 μm on the substrate 3.

The composition analyses were performed in the same manner as in Example 1. The results showed that the composition of K/(K+Na) in each film was 0.88 which substantially corresponds to the result of Example 1.

Figure 7A:
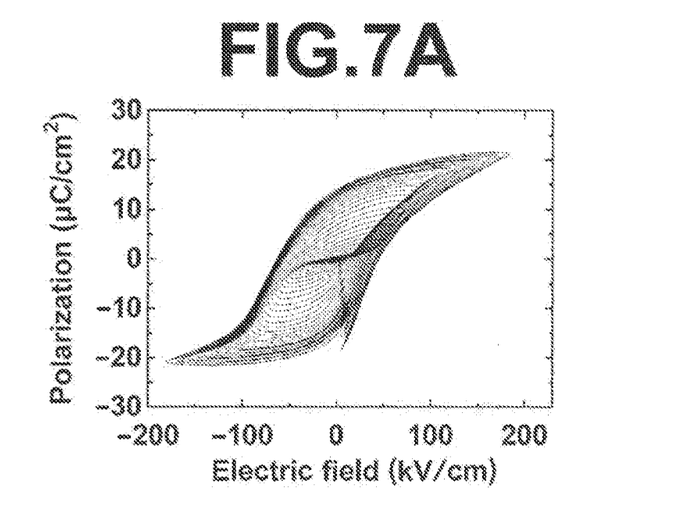
FIG. 7A illustrates P-E hysteresis characteristics of a film formed on a substrate 3 in Example 2.
Figure 7B:
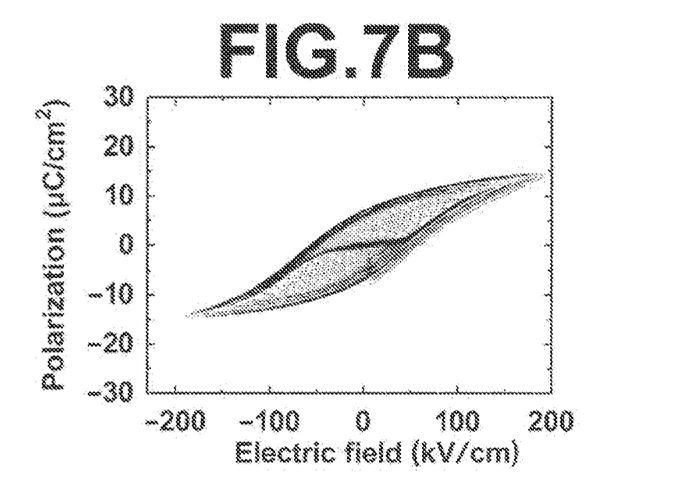
FIG. 7B illustrates P-E hysteresis characteristics of a film formed on a substrate 2 in Example 2.
Figure 8A:
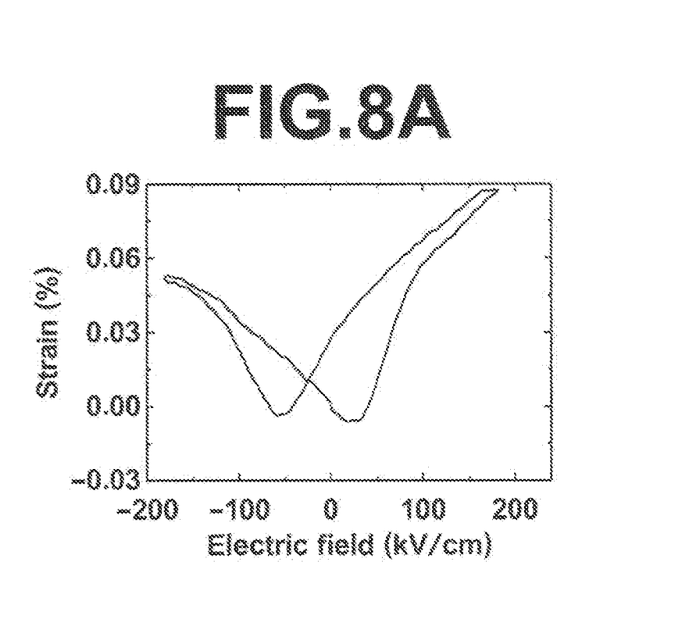
FIG. 8A illustrates piezoelectric properties of the film formed on the substrate 3 in Example 2.
Figure 8B:
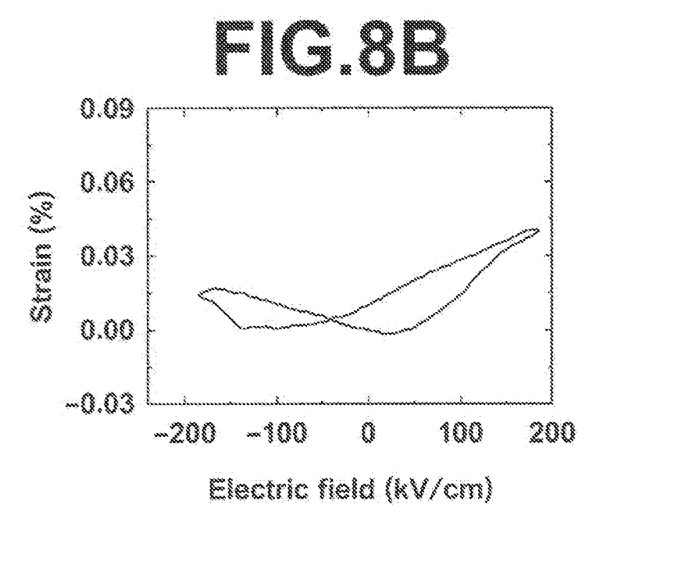
FIG. 8B illustrates piezoelectric properties of the film formed on the substrate 2 in Example 2.

The evaluations of the electrical characteristics and piezoelectric properties for each (K, Na)NbO$_3$ film formed were performed by providing a 100 μmφ Pt dot on the film as the upper electrode. FIGS. 7A and 7B illustrate P-E hysteresis characteristics of the films formed on the substrates 3 and 2 respectively. FIGS. 8A and 8B illustrate piezoelectric properties of the films formed on the substrate 3 and 2 respectively. As illustrated in FIGS. 7A and 7B, ferroelectricity was confirmed for both of the substrates 2 and 3 and it was confirmed that a higher Pr value is obtained when the substrate 3 is used.

In the mean time, piezoelectricity was confirmed for both substrates as illustrated in FIGS. 8A and 8B, and it was confirmed that the substrate 3 has a higher apparent piezoelectric constant d$_{33}$ obtained from the inclination, whereby the effectiveness of the oriented film has been confirmed.

Example 3

A 300 μm thick inconel substrate formed in a cantilever shape by wire electrical discharge machining was provided and SrRuO$_3$(SRO) was formed on the surface thereof with a thickness of about 120 nm as a buffer layer. The film forming conditions were similar to those of the substrate 2 in Example 2.

Then, a 20 ml of reaction solution having the same composition as that of No. 12 in Table 1 was prepared, and a (K, Na)NbO$_3$ film was formed on the SRO buffer layer with a thickness of about 6 μm as in each substrate in Example 2. The results of composition analysis performed in the same manner as in Example 1 showed that the composition of K/(K+Na) in the film was 0.88.

Next, an Au upper electrode was provided on the (K, Na)NbO$_3$ film by low vacuum vapor deposition, thereby providing a measuring sample (cantilever) for piezoelectric property evaluation. Note that the sample was not subjected to polarization treatment. The piezoelectric property evaluation was performed by a method in which a piezoelectric constant d$_{31}$ was calculated from frequency response characteristics obtained by a laser Doppler velocimeter (LDV) (Polytec, OFV3001). The piezoelectric constant d$_{31}$ can be calculated by a formula given below.

$$\delta = \frac{3L^2}{2t} \frac{2AB(1+B)^2}{A^2B^4 + 2A(2B+3B^2+2B^2)+1} d_{31} E \qquad \text{[Formula]}$$

$$t = hf + hs, \quad A = Es/Ef, \quad B = hs/hf$$

where, Ef is a Young's modulus of the (K, Na)NbO$_3$ film (6.5×10$^{10}$N/m, this time), Es is a Young's modulus of the inconel substrate, hf is an average thickness of the (K, Na)NbO$_3$ film, hs is an average thickness of the inconel substrate, E is an applied voltage, fs is a resonance frequency of the inconel substrate, Δf is a difference in resonance frequency between the substrate and sample, L is a length from the fixed end to open end, and δ is a vibration displacement.

Figure 9A:
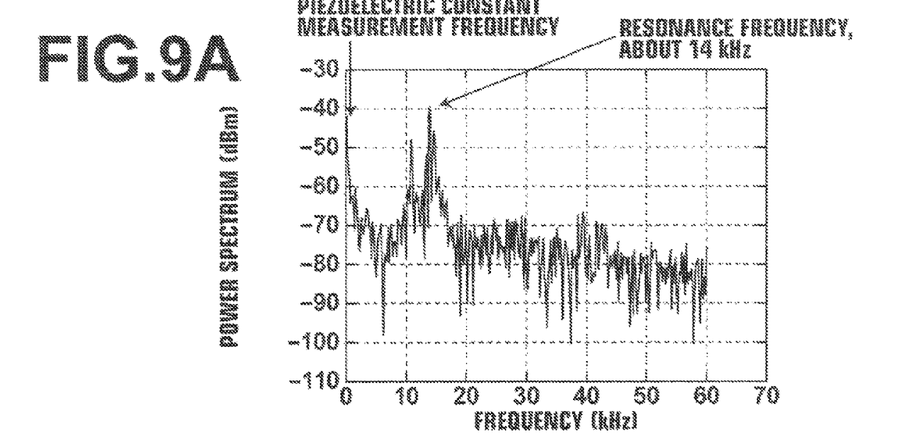
FIG. 9A illustrates frequency response characteristics of a cantilever sample in Example 3.
Figure 9B:
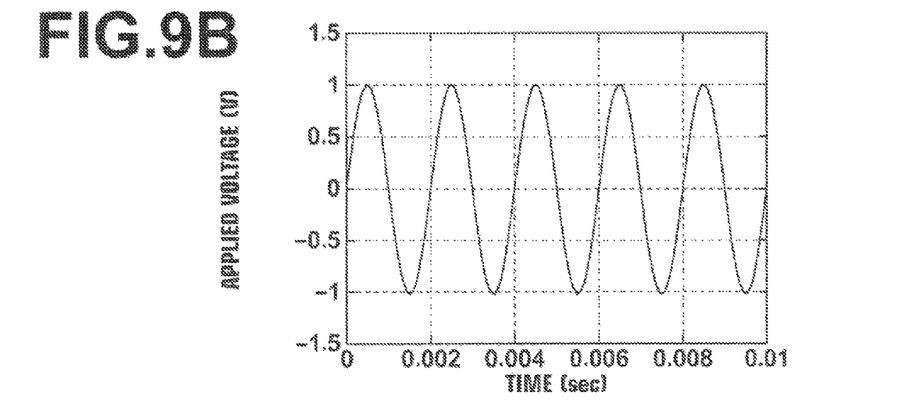
FIG. 9B illustrates the waveform of applied voltage during the evaluation of piezoelectric properties.
Figure 9C:
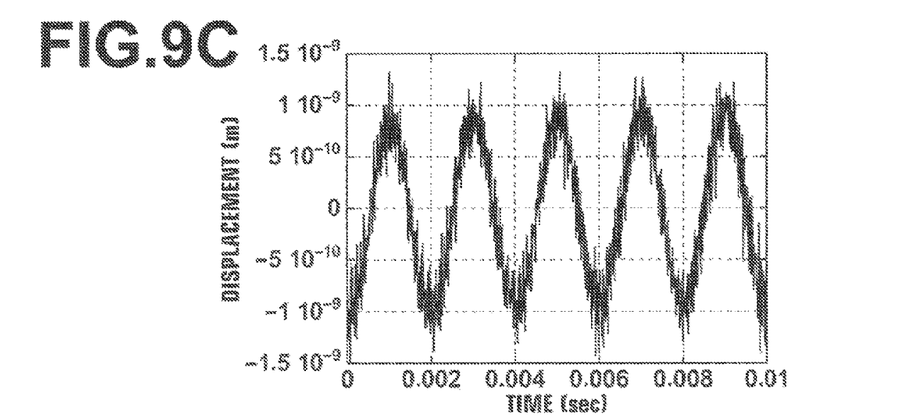
FIG. 9C illustrates a vibration displacement waveform.

The frequency response characteristics of the measuring sample by LDV, the applied voltage waveform (continuous driving at 500 Hz), and the vibration displacement waveform are shown in FIGS. 9A, 9B, and 9C respectively. As illustrated in FIG. 9A, the resonance frequency of the measuring sample was about 14 kHz. The vibration displacement waveform was measured at a frequency (500 Hz) remote from resonance frequency of the measuring sample and lower than the resonance frequency. Further, a resonance frequency of the substrate was also obtained by the same measurement method as described above. As a result, d$_{31}$ is about −34 pm/V, which substantially corresponds to a value (25~35 pm/V) expected from the value of d$_{33}$ by the general Poisson's ratio.

The present invention is favorably applicable to ferroelectric devices, such as ultrasound probes, non-volatile memories, and MEMS (micro electro-mechanical systems), and piezoelectric devices, including inkjet recording heads.

What is claimed is:

1. A perovskite oxide film formed on a substrate, wherein the film has an average film thickness of not less than 5 μm and includes a perovskite oxide represented by a general formula (P) given below:

$(K_{1-w-x}A_wB_x)(Nb_{1-y-z}C_yD_z)O_3$ (P), where: $0<w<1.0$, $0 \le x \le 0.2$, $0 \le y<1.0$, $0 \le z \le 0.2$, $0<w+x<1.0$; A is an A-site element having an ionic valence of 1 other than K, B is an A-site element, C is a B-site element having an ionic valence of 5, and D is a B-site element; each of A to D is one kind or a plurality of kinds of metal elements; and although 1:3 is a standard ratio of the total number of moles of the A-site elements and of the total number of moles of the B-site elements to the number of moles of the oxygen atoms, the ratio may be deviated from 1:3 within a range in which a perovskite structure can be formed.

2. The perovskite oxide film of claim 1, wherein the substrate has a lattice constant of 0.37 to 0.425 nm.

3. The perovskite oxide film of claim 1, wherein the substrate includes, as a major component, a compound selected from the group consisting of strontium titanate, potassium tantalite, calcium fluoride, scandium perovskite oxide, nickel perovskite oxide, and yttria-stabilized zirconia.

4. The perovskite oxide film of claim 1, wherein the substrate is a metal substrate.

5. The perovskite oxide film of claim 1, wherein the substrate is a resin substrate.

6. The perovskite oxide film of claim 1, wherein the element A is at least one kind of metal element selected from the group consisting of Li, Na, Rb, and Cs.

7. The perovskite oxide film of claim 1, wherein the element B is at least one kind of metal element selected from the group consisting of Ca, Sr, Ba, Sn, Pb, Y, La, and Bi.

8. The perovskite oxide film of claim 1, wherein the element C is at least one kind of metal element selected from the group consisting of V, Sb, and Ta.

9. The perovskite oxide film of claim 1, wherein the element D is at least one kind of metal element selected from the group consisting of Ti, Mn, Cr, Fe, Co, Ni, Cu, and Zn.

10. The perovskite oxide film of claim 1, wherein the film thickness is not less than 10 μm.

11. The perovskite oxide film of claim 10, wherein the film thickness is not less than 50 μm.

12. The perovskite oxide film of claim 1, wherein the film has a crystalline orientation.

13. The perovskite oxide film of claim 12, wherein the film is an epitaxial film.

14. The perovskite oxide film of claim 1, wherein the film is a ferroelectric film.

15. A ferroelectric device, comprising a substrate, the perovskite oxide film of claim 14, and a pair of electrodes for applying an electric field to the perovskite oxide film.

16. The ferroelectric device of claim 15, wherein the substrate has a lattice constant of 0.37 to 0.425 nm.

17. The ferroelectric device of claim 15, wherein:
the pair of electrodes comprises a back contact electrode formed between the substrate and the perovskite oxide film and an upper electrode formed on the perovskite oxide film; and
the back contact electrode includes, as a major component, Pt, $LaNiO_3$, a lanthanum layered perovskite compound, or $SrRuO_3$.

18. The ferroelectric device of claim 15, wherein the substrate is a metal substrate or a resin substrate and the ferroelectric device comprises a buffer layer between the substrate and the back contact electrode.

19. A perovskite oxide film forming method for forming the perovskite oxide film of claim 1, wherein the film forming is performed by hydrothermal synthesis.

20. The perovskite oxide film forming method of claim 19, wherein the film forming is performed at a film forming temperature of not greater than 300° C.

* * * * *